(12) United States Patent
Horváth et al.

(10) Patent No.: US 11,575,370 B2
(45) Date of Patent: *Feb. 7, 2023

(54) POWER TRANSISTOR DETECTION WITH SELF-PROTECTION

(71) Applicant: Skyworks Solutions, Inc., Irvine, CA (US)

(72) Inventors: András V. Horváth, Budapest (HU); Carlos Briseno-Vidrios, Austin, TX (US); Viktor Zsolczai, Szolnok (HU); Soma Ur, Telki (HU)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/749,419

(22) Filed: May 20, 2022

(65) Prior Publication Data

US 2022/0278677 A1   Sep. 1, 2022

Related U.S. Application Data

(63) Continuation of application No. 16/588,777, filed on Sep. 30, 2019, now Pat. No. 11,342,910.

(51) Int. Cl.
  *H03K 17/082*   (2006.01)
  *H04L 12/10*   (2006.01)
  *G06F 1/26*   (2006.01)

(52) U.S. Cl.
  CPC ......... *H03K 17/0822* (2013.01); *G06F 1/266* (2013.01); *H04L 12/10* (2013.01)

(58) Field of Classification Search
  CPC .......... H03K 17/0822; H03K 17/08122; G06F 1/266; H04L 12/10; H04L 12/40045
  See application file for complete search history.

(56) References Cited

U.S. PATENT DOCUMENTS

| | | | | |
|---|---|---|---|---|
| 5,073,757 A | * | 12/1991 | George | G01R 27/2605 324/649 |
| 5,576,628 A | | 11/1996 | Caliboso | |
| 6,356,086 B1 | * | 3/2002 | Cook | G01R 31/64 324/659 |
| 10,469,057 B1 | | 11/2019 | Frank | |
| 2004/0135528 A1 | | 7/2004 | Yasohara | |
| 2005/0270042 A1 | | 12/2005 | Doljack | |
| 2006/0164117 A1 | | 7/2006 | Sander | |
| 2009/0195080 A1 | | 8/2009 | Diab | |
| 2009/0201037 A1 | | 8/2009 | Diab | |

* cited by examiner

*Primary Examiner* — Jaweed A Abbaszadeh
*Assistant Examiner* — Brian J Corcoran
(74) *Attorney, Agent, or Firm* — Knobbe, Martens, Olson & Bear, LLP (57) ABSTRACT

A method for establishing a powered link over a transmission line includes providing a constant, predetermined current to a terminal thereby causing a power transistor coupled to the terminal to conduct in a subthreshold region of transistor operation without current flowing between a drain terminal of the power transistor and a source terminal of the power transistor. The method includes estimating a size of the power transistor using a digital time signal indicative of an amount of time the constant, predetermined current is provided before a voltage level on the terminal exceeds a predetermined voltage level. In an embodiment, the predetermined voltage level is less than a threshold voltage of the power transistor.

20 Claims, 6 Drawing Sheets

POWER TRANSISTOR DETECTION WITH SELF-PROTECTION

CROSS-REFERENCE TO RELATED APPLICATION(S)

This application is a continuation of U.S. patent application Ser. No. 16/588,777, filed Sep. 30, 2019, entitled "Power Transistor Detection with Self-Protection," naming András V. Horvath, Carlos Briseno-Vidrios, Viktor Zsolczai, and Soma Ur as inventors, which application is incorporated herein by reference in its entirety.

BACKGROUND

Field of the Invention

The invention relates to electronics systems, and more particularly to electronics systems that communicate power over transmission lines.

Description of the Related Art

In a conventional system that provides power over transmission lines (e.g., a Power over Ethernet system), power sourcing equipment provides electric power using cabling including at least two conductors (e.g., Ethernet cabling) that concurrently communicates data between power sourcing equipment and a powered device. Power sourcing equipment provides power to the powered device after detecting presence of the powered device coupled to the transmission line and after negotiating a power level to be provided to the powered device. The conventional system requires the power sourcing equipment to be coupled to a power transistor of a specific size or the power sourcing equipment is designed to drive a power transistor having a specific size. The fixed size of the power transistor limits customer solutions and may require redesign later in response to changes in availability of power transistors. Accordingly, improved techniques for providing power to devices over transmission lines are desired.

SUMMARY OF EMBODIMENTS OF THE INVENTION

In at least one embodiment, a method for establishing a powered link over a transmission line includes providing a constant, predetermined current to a terminal thereby causing a power transistor coupled to the terminal to conduct in a subthreshold region of transistor operation without current flowing between a drain terminal of the power transistor and a source terminal of the power transistor. The method includes estimating a size of the power transistor using a digital time signal indicative of an amount of time the constant, predetermined current is provided before a voltage level on the terminal exceeds a predetermined voltage level. In an embodiment, the predetermined voltage level is less than a threshold voltage of the power transistor.

In at least one embodiment, a system for delivering power over a transmission line includes a terminal, a current source configured to provide a constant, predetermined current to the terminal thereby causing a power transistor coupled to the terminal to conduct in a subthreshold region of transistor operation without current flowing between a drain terminal of the power transistor and a source terminal of the power transistor. The system includes a circuit configured to estimate a size of the power transistor using a digital time signal indicative of an amount of time the constant, predetermined current is provided before a voltage level on the terminal exceeds a predetermined voltage level. In an embodiment, the predetermined voltage level is less than a threshold voltage of the power transistor.

In at least one embodiment, a method for establishing a powered link over a transmission line includes prior to entering a normal mode of operation, estimating a size of a power transistor coupled to a terminal using a digital time signal indicative of an amount of time the power transistor conducts in a subthreshold region of transistor operation without current flowing between a drain terminal of the power transistor and a source terminal of the power transistor before a voltage level on the terminal exceeds a predetermined voltage level. The method includes configuring a power sourcing equipment based on the size of the power transistor estimated prior to entering the normal mode of operation. In an embodiment, the predetermined voltage level is less than a threshold voltage of the power transistor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
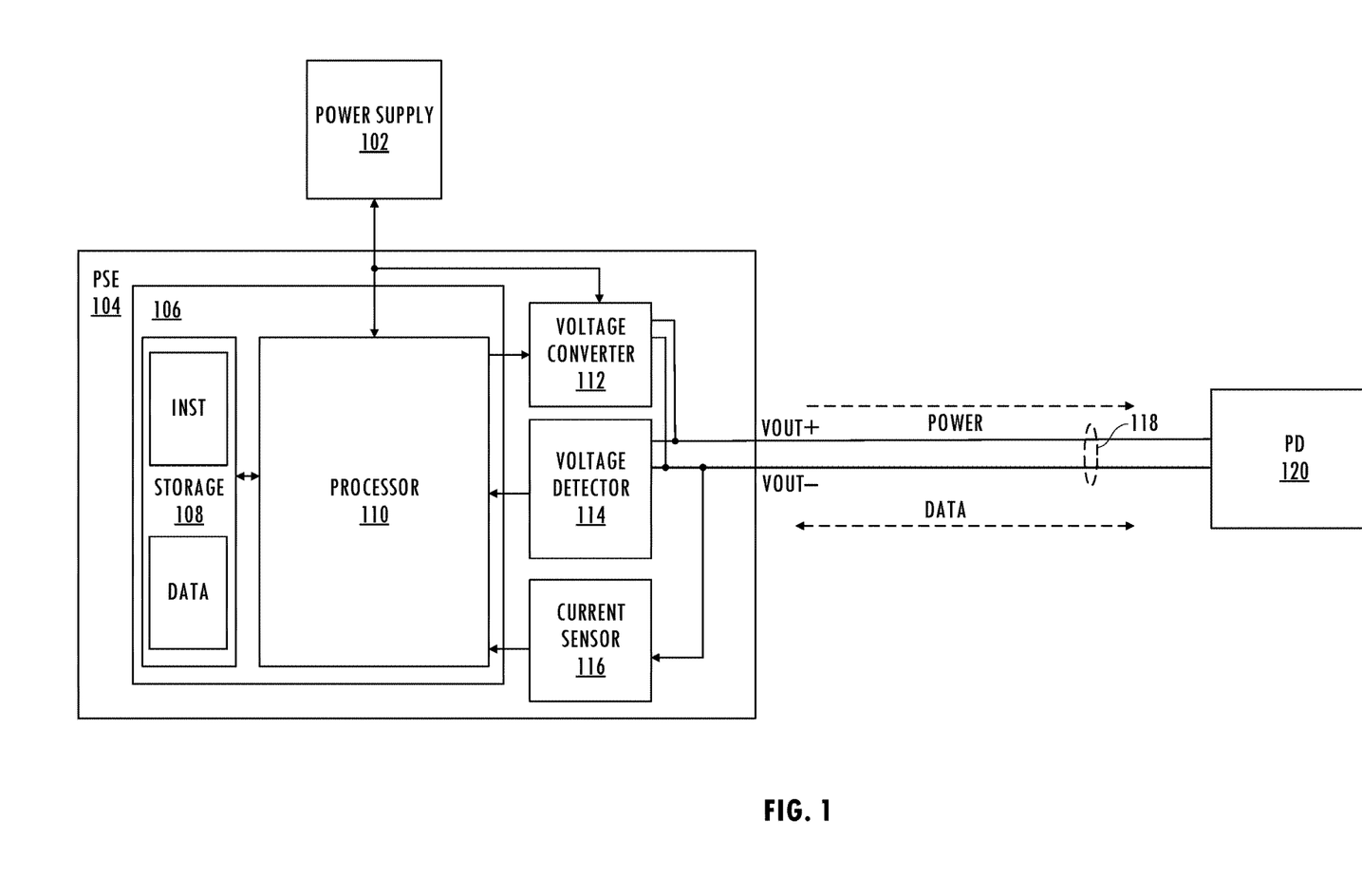
FIG. 1 illustrates a functional block diagram of an exemplary system including a power sourcing equipment coupled to a powered device.

Referring to FIG. 1, in a typical wired Ethernet application (e.g., a wired Ethernet application consistent with Institute of Electrical and Electronics Engineers (IEEE) Standard 802.3, which defines a physical layer and data link layer media access control for wired Ethernet applications), power sourcing equipment 104 (e.g., a hub, network switch, router, or other node or infrastructure device compliant with IEEE Standard 802.3) provides power to powered device 120 using transmission line 118. Transmission line 118 includes at least two conductors (e.g., twisted pair cable, coaxial cable, or other transmission line including at least two conductors). Power-sourcing equipment 104 receives power from power supply 102 and includes controller 106, voltage converter 112, voltage detector 114, and current sensor 116. Controller 106 includes processor 110 configured to execute instructions stored in storage 108 to control power output to transmission line 118 based on voltages and currents sensed on transmission line 118. Powered device 120 receives power from power sourcing equipment 104 over transmission line 118 and communicates data to power sourcing equipment 104 over transmission line 118.

Figure 2:
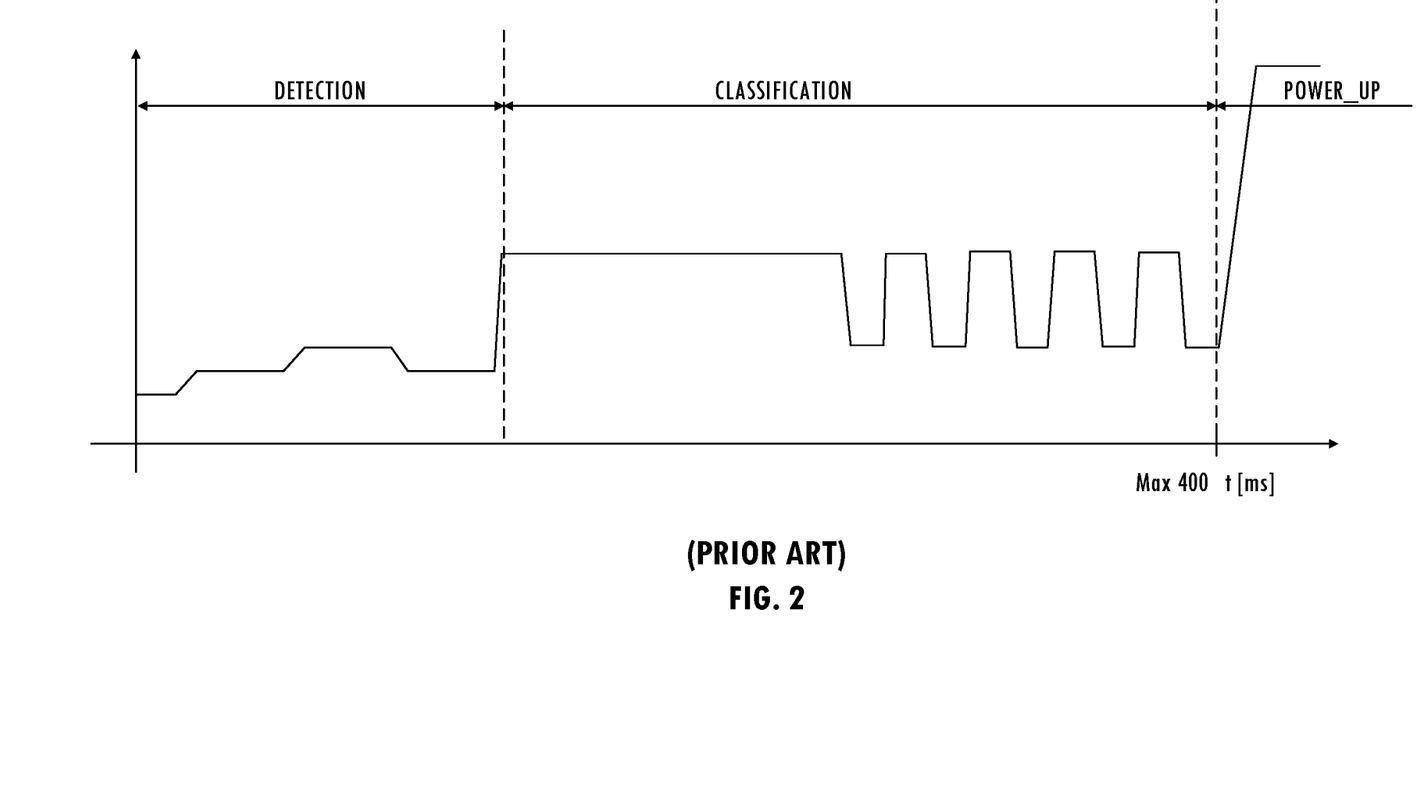
FIG. 2 illustrates an exemplary signal timing diagram for an output voltage during conventional operation of the system of FIG. 1.
Figure 3:
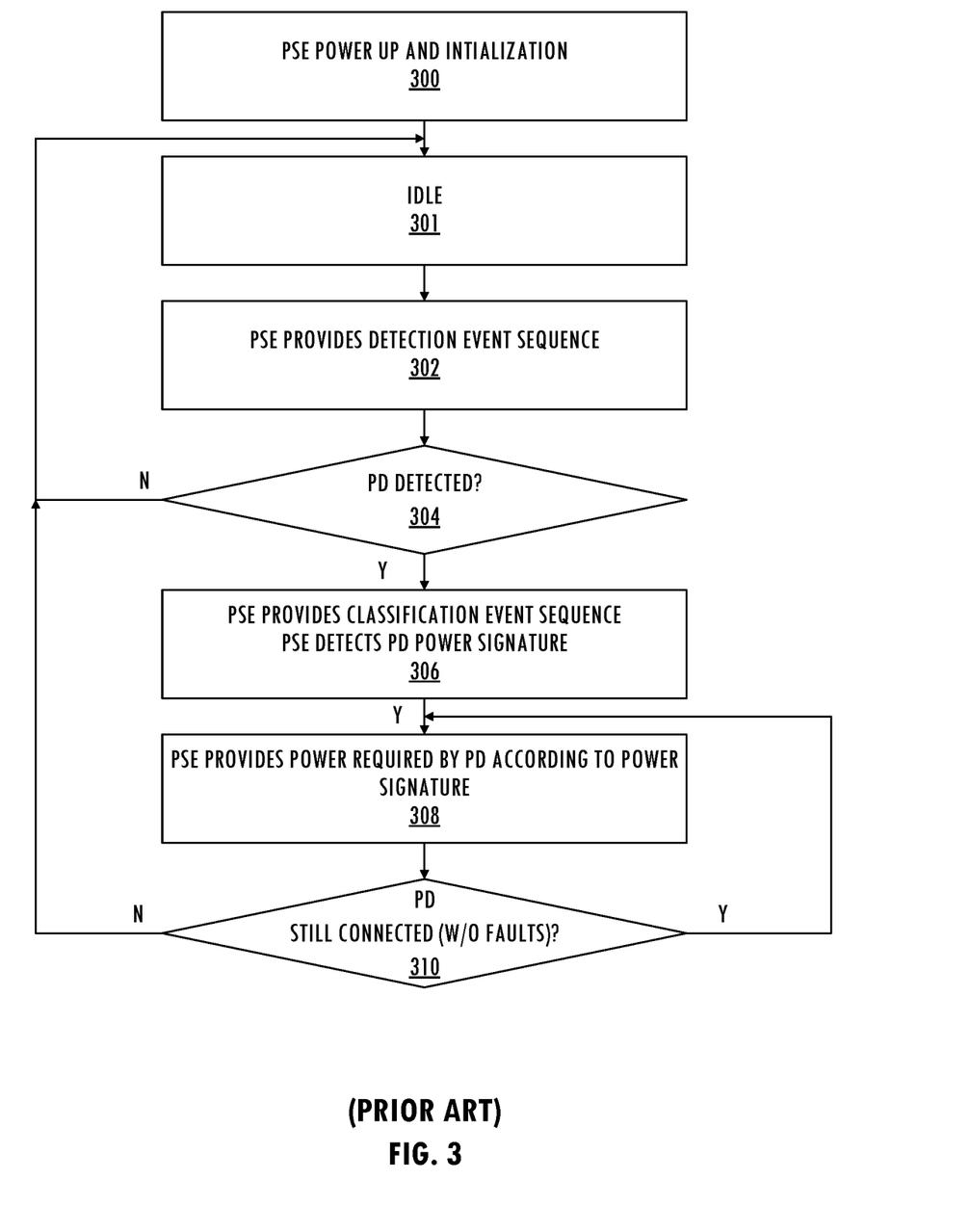
FIG. 3 illustrates exemplary information and control flows for conventional operation of the system of FIG. 1.

Referring to FIGS. 1-3, after power up and initialization, power sourcing equipment 104 may detect, classify, and provide power to powered device 120 by providing a predetermined sequence of voltages on a port (e.g., differential pair of terminals $V_{OUT}+$ and $V_{OUT}-$) coupled to powered device 120 via transmission line 118. For example, after power up and initialization (300), power sourcing equipment 104 enters an idle state (301) followed by a detection state that senses a predetermined nominal signature resistance (e.g., 25 kΩ) in parallel with up to a predetermined amount of capacitance. Powered device 120 couples a detection signature circuit across two conductors of transmission line 118 (e.g., conductors of transmission line 118 coupled to differential pair of terminals $V_{OUT}+$ and $V_{OUT}-$). Power sourcing equipment 104 provides a detection event sequence to transmission line 118 (302). Meanwhile, current sensor 116 monitors the current consumption to detect presence of powered device 120 coupled to transmission line 118. The detection signature circuit of powered device 120 coupled across differential pair of terminals $V_{OUT}+$ and $V_{OUT}-$ creates a resistive signature that causes power sourcing equipment 104 to detect a valid powered device.

In at least one embodiment, power sourcing equipment 104 evaluates the presence of a valid powered device 120 by making at least two measurements using port voltage values that create at least a 1V voltage drop. Power sourcing equipment 104 calculates an effective resistance from two or more measurements made during the detection mode. An exemplary detection event sequence starts with output voltage $V_{OUT}$ equal to 0 Volts, and then varies $V_{OUT}$ from 4 V for 20 ms to 8 V for 20 ms and then back to 4 V for 50 ms, although other detection event sequences may be used. If power sourcing equipment 104 detects a signature resistance in a predetermined range (e.g., 17 kΩ to 29 kΩ) (304), then power sourcing equipment 104 enters a classification state (306). If power sourcing equipment 104 fails to detect a resistance of the powered device in the predetermined range (304), power sourcing equipment 104 may return to the idle state (301) and periodically repeat the detection event sequence (302).

In the classification state, power sourcing equipment 104 interrogates powered device 120 to determine its power requirement and provides an indication to powered device 120 of power allocated to powered device 120 (306). Although different techniques may be used to determine the power requirements of a powered device, an embodiment of power sourcing equipment 104 provides a pulse of predetermined classification voltage with a predetermined current limit (e.g., 18 V and 75 mA, respectively) for a predetermined time (e.g., 30 ms) across differential pair of terminals $V_{OUT}+$ and $V_{OUT}-$. In another embodiment, power sourcing equipment 104 repeats the pulse once. An exemplary two-event classification event sequence outputs the pulse of the classification voltage and mark voltage twice with a predetermined amount of time at a mark voltage between the two pulses (e.g., a classification voltage between 15.5 V and 20.5 V and a mark voltage between 7 V and 10 V). In general, the mark voltage is a voltage level that provides sufficient power to the powered device to maintain its classification state, and in systems implementing other protocols, the mark voltage may have a different name and different signal level range. Current sensor 116 of power sourcing equipment 104 senses a current on transmission line 118 during the pulse and classifies an expected power consumption of powered device 120 based on the sensed current and predetermined supported current ranges. If the sensed current does not fall within a supported current range, power sourcing equipment 104 indicates an error condition.

In at least one embodiment, after applying the classification probe voltage and measuring the classification signature current of powered device 120, power sourcing equipment 104 returns the output voltage (e.g., the voltage across differential pair of terminals $V_{OUT}+$ and $V_{OUT}-$) to a mark voltage range before applying another classification probe voltage or powering up powered device 120. Power sourcing equipment 104 may apply multiple events (e.g., up to five events) before powering up powered device 120. Power sourcing equipment 104 provides a sequence of classification and mark events to powered device 120 that indicates the power allocated to powered device 120. Powered device 120 may present different class signatures during different events of the sequence to power sourcing equipment 104 to indicate the classification of powered device 120. Power sourcing equipment 104 may present different numbers of events in the sequence to powered device 120 to indicate that a power level requested by powered device 120 is unavailable, causing powered device 120 to operate in a power state lower than requested. However, note that the classification event sequences, sensed current range, and expected peak power consumption of a powered device may vary by application.

If power sourcing equipment 104 successfully classifies powered device 120 (306), then power sourcing equipment 104 proceeds to power up powered device 120 after a last mark event of the classification event sequence within a predetermined period (e.g., less than 400 ms from the end of the detection event sequence). Power sourcing equipment 104 applies a signal level to differential pair of terminals $V_{OUT}+$ and $V_{OUT}-$ based on the power level determined based on the power signature detected during classification or negotiated with powered device 120 (308) so long as power sourcing equipment 104 does not detect a fault (e.g., input under voltage lockout, overvoltage lockout, overcurrent, or other fault condition) or a disconnect event (310).

Figure 4:
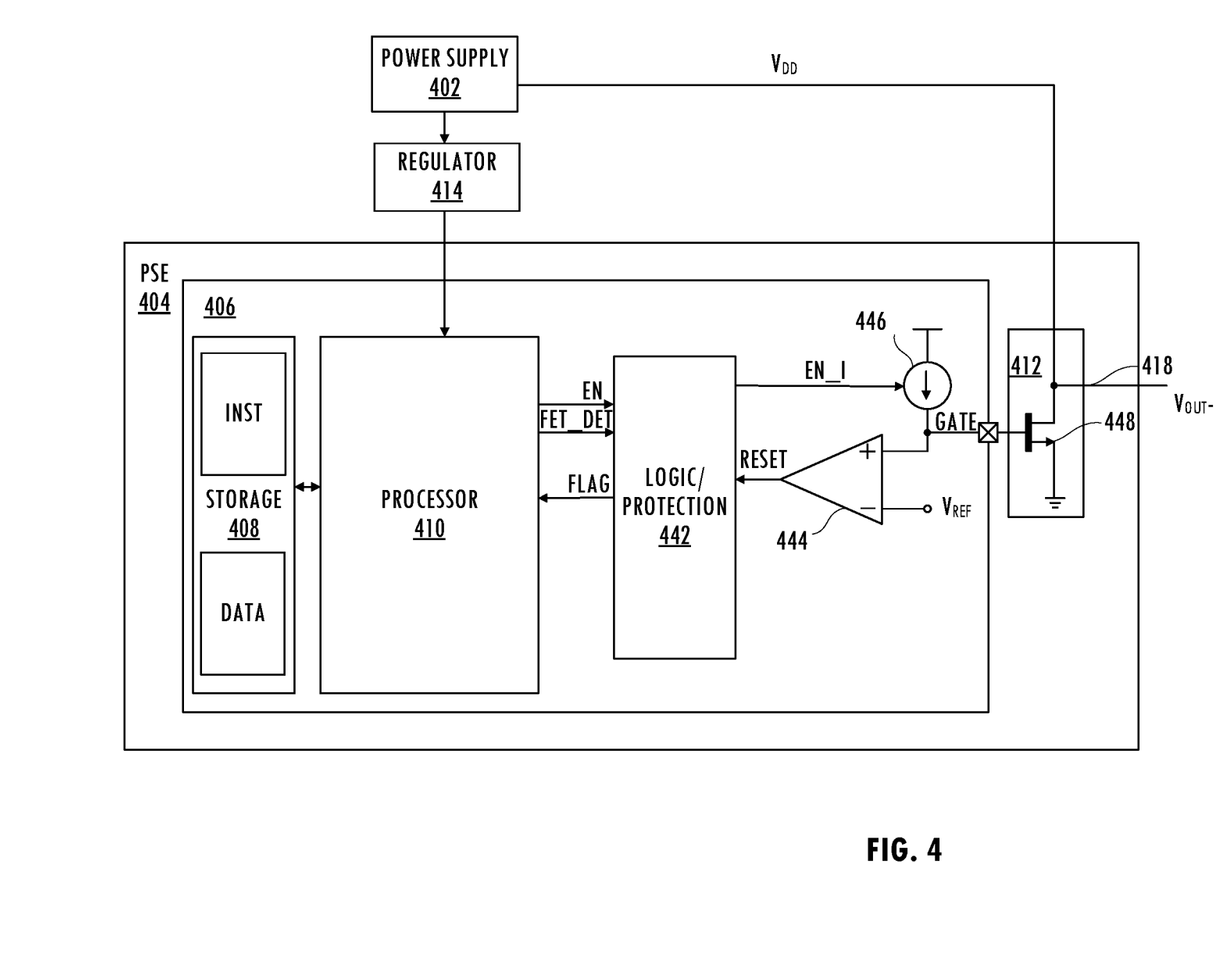
FIG. 4 illustrates a functional block diagram of power sourcing equipment including power transistor detection and self-protection consistent with at least one embodiment of the invention.

In at least one embodiment, voltage converter 112 of power sourcing equipment 104 of FIG. 1 includes a discrete power transistor of predetermined size coupled between an integrated circuit solution for controller 106 and a conductor of transmission line 118 via the differential pair of terminals $V_{OUT}+$ and $V_{OUT}-$. Referring to FIG. 4, power sourcing equipment 404 is compliant with IEEE Standard 802.3 and is operable with power transistors of different sizes. Power-sourcing equipment 404 receives a voltage level (e.g., 3V or 5V) from power supply 402 via voltage regulator 414 and includes controller 406 and power transistor 448. Controller 406 includes processor 410 configured to execute instructions stored in storage 408, although in other embodiments of power sourcing equipment 404, an application-specific integrated circuit implements the functions of controller 406 described herein.

In at least one embodiment, voltage converter 412 includes power transistor 448 that when enabled (i.e., has drain-to-source conduction), delivers power to transmission line 418. Power transistor 448 can be a double-diffused metal-oxide-semiconductor (DMOS) transistor, laterally-diffused MOS (LDMOS) transistor, or other power transistor that can handle large voltages and currents (e.g., 50 V). The size of power transistor 448 is not predetermined. In at least one embodiment, power transistor 448 can have a size that falls within a predetermined range of power transistor sizes (e.g., input capacitance $C_{ISS}$ in the range of 300 picofarads to 3 nanofarads). In an embodiment of power sourcing equipment 404, power transistor 448 has a size that is one of a predetermined set of sizes, e.g., a small size, a medium size, or a large size, where the size of a large power transistor is three times the size of a small power transistor. In other embodiments, power transistor 448 has a size within a predetermined range of sizes (e.g., $size_{MIN} \le size \le N \times size_{MAX}$, where N>1). In general, the gain factor of power transistor 448 is determined by the gate-to-source capacitance of power transistor 448. During power-up and initialization (300) of FIG. 3 and prior to providing a detection event sequence (302), power sourcing equipment 404 of FIG. 4 estimates a size of power transistor 448 without turning on power transistor 448, i.e., transistor 448 is in a weak inversion region of transistor operation and no conduction occurs between the drain and source terminals of transistor 448. Thus, power sourcing equipment 404 is able to estimate a size of power transistor 448 without accidentally turning on a powered device coupled to transmission line 418, thereby protecting a powered device from receiving power prior to detection and classification, receiving harmful power levels, and premature power-up.

In at least one embodiment, controller 406 enables current source 446 to provide a small pulse of a constant, predetermined current to a gate terminal of power transistor 448. Controller 406 uses the gate-to-source capacitance of power transistor 448 as a proxy for the size of power transistor 448. The gate-to-source capacitance of power transistor is inversely related to the on-resistance of power transistor 448. In general, a power transistor with a smaller gate-to-source capacitance will reach a predetermined gate voltage faster than a transistor with a higher gate-to-source capacitance. Since a constant current is used to charge the gate of power transistor 448, the measured pulse width of control signal FLAG is linearly related to the gate-to-source capacitance of power transistor 448.

Figure 5:
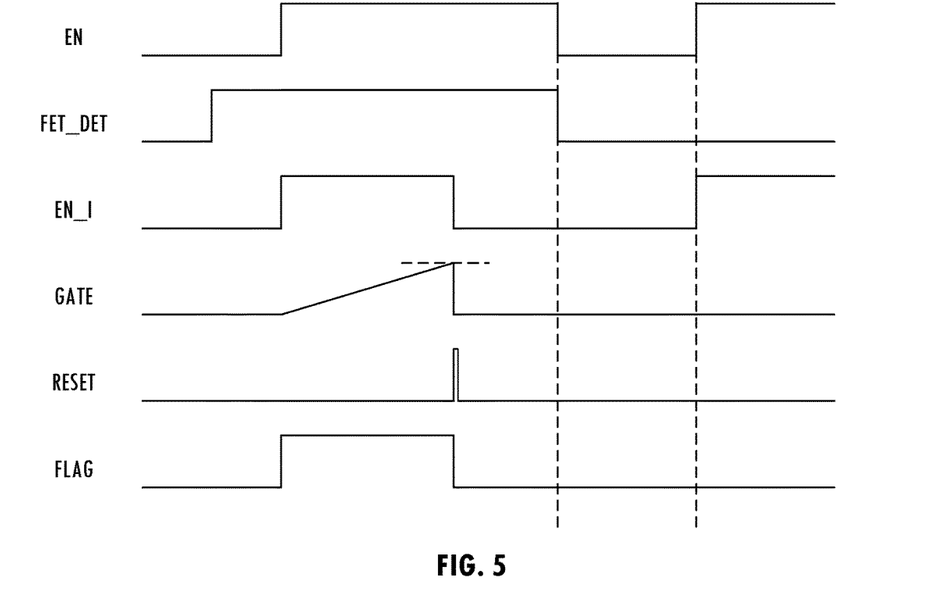
FIG. 5 illustrates exemplary waveforms for the power sourcing equipment including power transistor detection and self-protection of FIG. 4 consistent with at least one embodiment of the invention.

Referring to FIGS. 4 and 5, a reset of power sourcing equipment 404 clears control signals EN, FET_DET, EN_I, RESET, and FLAG and current source 446 is disabled and does not deliver any current to gate terminal GATE. After power-up and initialization of power-sourcing entity 404, sets control signal FET_DET, and controller 406 enters a transistor detection mode of operation. Controller 406 enables logic protection circuit 442, which sets control signal EN_I, thereby enabling current source 446 to deliver current to gate terminal GATE. The current delivered to gate terminal GATE charges the gate-to-source capacitance of power transistor 448, thereby generating a voltage on gate terminal GATE.

In at least one embodiment, power transistor 448 is an n-type transistor. Comparator 444 senses the voltage on gate terminal GATE and compares it to predetermined reference voltage level $V_{REF}$ (e.g., 1 V for power transistors having threshold voltages greater than 1 V). Predetermined reference voltage level $V_{REF}$ is less than a threshold voltage (i.e., $V_T$) of a power transistor, in general, but greater than zero. Comparator 444 generates control signal RESET according to the comparison, e.g., setting control signal RESET when the voltage on gate terminal GATE equals or exceeds predetermined reference voltage level $V_{REF}$. While the voltage on gate terminal GATE is below predetermined reference voltage level $V_{REF}$, control signal RESET remains clear and control signal FLAG remains set. Logic/protection circuit 442 simultaneously sets indicator signal FLAG and enables current source 446 to deliver a constant, predetermined current (e.g., a constant current of 20 microamperes) to the gate of power transistor 448.

The constant predetermined current causes the gate capacitance to charge and the voltage on terminal GATE to ramp from 0 V to a voltage level that does not exceed the threshold voltage of power transistor 448. When the gate-to-source capacitance of power transistor 448 reaches predetermined voltage level $V_{REF}$, comparator 444 changes the state of control signal RESET. In response to that change in state of control signal RESET, logic/protection circuit 442 clears indicator signal FLAG, which causes logic/protection circuit 442 to clear control signal EN_I, thereby disabling current source 446. By disabling current source 446, the voltage on terminal GATE does not substantially exceed predetermined voltage level $V_{REF}$, thereby protecting a powered device from dangerous power levels that may occur prior to detection and classification, described above. Then, the voltage on terminal GATE falls below predetermined voltage level $V_{REF}$, thereby maintaining power transistor 448 in a subthreshold region of operation (i.e., in an 'OFF' state where no conduction occurs between the source terminal and the drain terminal), causing comparator 444 to clear control signal RESET. The pulse of control signal RESET causes logic/protection circuit 442 to clear control signal EN_I and indicator signal FLAG. In other embodiments, power transistor 448 is a p-type transistor, predetermined reference voltage level $V_{REF}$ is less than power supply voltage VDD, but is greater than a threshold voltage of the power transistor, and the operation of the power transistor detection circuit with self-protection is configured accordingly. In addition, control signals EN, FET_DET, EN_I, RESET, and FLAG are exemplary only and other combinations of control signals may be used to charge the gate capacitance of power transistor 448 and cause the voltage on terminal GATE to ramp from 0 V to a voltage level that does not exceed the threshold voltage of power transistor 448.

Processor 410 performs a time-to-digital conversion of the time that indicator signal FLAG is set. The time that indicator signal FLAG is set is linearly related to the gate-to-source capacitance and the size of power transistor 448. Processor 410 uses the digital time value corresponding to the time that indicator signal FLAG is set to estimate a size of power transistor 448 (e.g., by comparing the digital time value to predetermined digital time values). After estimating the size of power transistor 448, power sourcing equipment 404 configures control loop parameters for normal operation of power sourcing equipment. For example, control loop parameters are set for a voltage control loop including power transistor 448 that forces a predetermined voltage to powered device 120, as illustrated in FIG. 2. Current loop parameters are set for a current control loop including power transistor 448 to limit the current consumption of powered device 120. The size of power transistor 448 is used to identify parameters that configure the control loops to be fast enough to meet PoE specifications and to be stable (i.e., reduce or eliminate oscillators). After configuring current source 446, power sourcing equipment 404 may resume normal operation. For example, power sourcing equipment 404 begins detection and classification, as described above.

Figure 6:
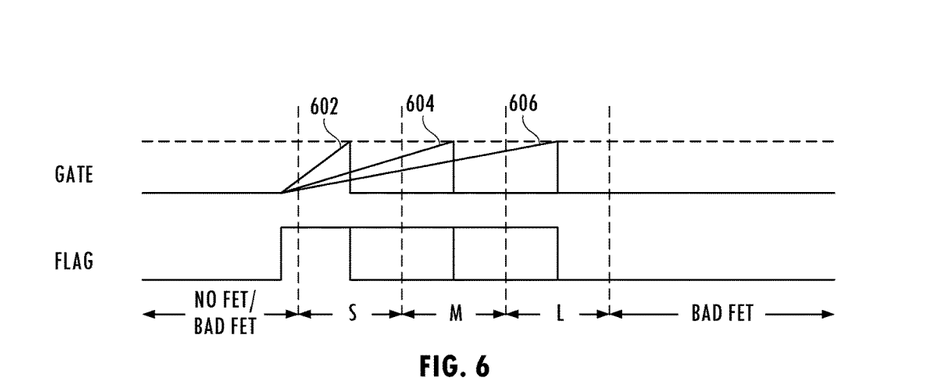
FIG. 6 illustrates exemplary waveforms for detecting a power transistor having a size in a predetermined range consistent with at least one embodiment of the invention.
Figure 7:
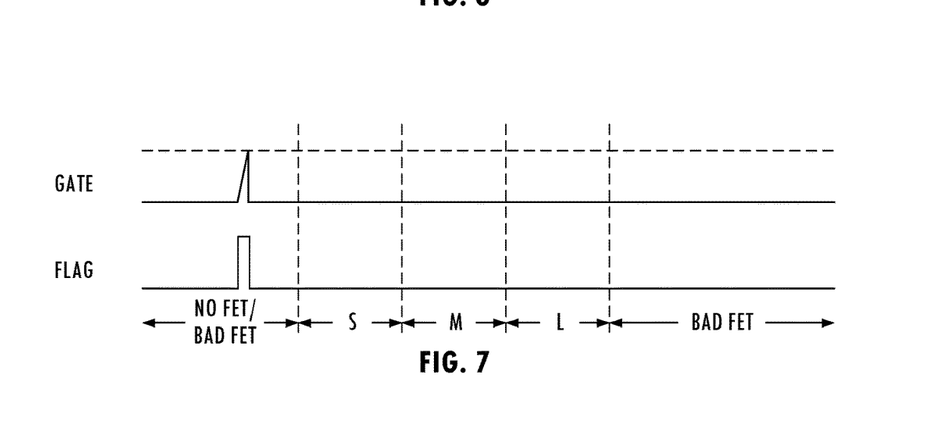
FIG. 7 illustrates exemplary waveforms for detecting a faulty power transistor or the absence of a power transistor coupled to power sourcing equipment consistent with at least one embodiment of the invention.
Figure 8:
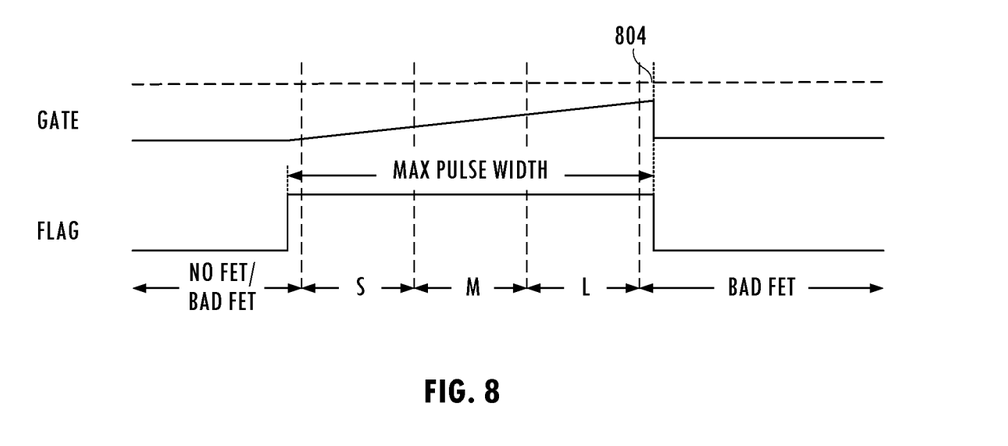
FIG. 8 illustrates exemplary waveforms for detecting an unsupported power transistor or a faulty power transistor coupled to power sourcing equipment consistent with at least one embodiment of the invention.

Referring to FIGS. 4 and 6, in at least one embodiment, three different time ranges are used to categorize a size of power transistor 448 and determine that power transistor has a size within a predetermined range. For example, if the voltage on terminal GATE ramps from 0 V to predetermined reference voltage level $V_{REF}$ and control signal FLAG includes pulse 602 that is within range S of digital time values, then processor 410 determines that power transistor 448 is a small sized transistor. If the voltage on terminal GATE ramps from 0 V to predetermined reference voltage level $V_{REF}$ and control signal FLAG includes pulse 604 that is within range W of digital time values, then processor 410 determines that power transistor 448 is a medium sized transistor. If the voltage on terminal GATE ramps from 0 V to predetermined reference voltage level $V_{REF}$ and control signal FLAG includes pulse 606 that is within range L of digital time values, then processor 410 determines that power transistor 448 is a large sized transistor. Referring to FIGS. 4 and 7, if the voltage on terminal GATE ramps from 0 V to predetermined reference voltage level $V_{REF}$, then control signal FLAG includes a pulse having a width less than a minimum pulse width (i.e., less than the range of a small sized transistor) and processor 410 determines that the digital time signal is less than a predetermined minimum value of the digital time signal. Accordingly, processor 410 determines that power transistor 448 is defective or absent and generates an indication of an error. Referring to FIGS. 4 and 8, if the voltage on terminal GATE ramps from 0 V and does not reach predetermined reference voltage level $V_{REF}$ within a maximum time, the control signal FLAG includes a pulse of a maximum width (i.e., greater than the range of a large sized transistor) and processor 410 determines that the digital time signal exceeds a predetermined maximum value of the digital time signal. Accordingly, processor 410 determines that power transistor 448 has an unsupported size or is defective, aborts the detection process by resetting control signal EN, and generates an indication of an error.

Structures described herein may be implemented using software executing on a processor (which includes firmware) or by a combination of software and hardware. Software, as described herein, may be encoded in at least one tangible (i.e., non-transitory) computer-readable medium. As referred to herein, a tangible computer-readable medium includes at least a disk, tape, or other magnetic, optical, or electronic storage medium (e.g., random access memory, read-only-memory).

The description of the invention set forth herein is illustrative and is not intended to limit the scope of the invention as set forth in the following claims. For example, while the invention has been described in an embodiment in which a Power over Ethernet application is described, one of skill in the art will appreciate that the teachings herein can be utilized in other applications where an estimated size of an external transistor is useful for configuring a system. The terms "first," "second," "third," and so forth, as used in the claims, unless otherwise clear by context, is to distinguish between different items in the claims and does not otherwise indicate or imply any order in time, location or quality. For example, "a first signal," "a second signal," does not indicate or imply that the first signal occurs in time before the second signal. Variations and modifications of the embodiments disclosed herein may be made based on the description set forth herein, without departing from the scope of the invention as set forth in the following claims.

What is claimed is:

1. A method for establishing a powered link over a transmission line comprising:
   providing a constant, predetermined current to a terminal thereby causing a power transistor coupled to the terminal to conduct in a subthreshold region of transistor operation without current flowing between a drain terminal of the power transistor and a source terminal of the power transistor; and
   estimating a size of the power transistor using a digital time signal indicative of an amount of time the constant, predetermined current is provided before a voltage level on the terminal exceeds a predetermined voltage level.

2. The method as recited in claim 1 wherein the predetermined voltage level is less than a threshold voltage of the power transistor.

3. The method as recited in claim 1 wherein the estimating comprises:
   enabling a current source to provide the constant, predetermined current to the terminal;
   disabling the current source in response to an indication of the voltage level equaling or exceeding the predetermined voltage level; and
   generating the digital time signal based on the enabling and the disabling.

4. The method as recited in claim 3 wherein the estimating further comprises:
   sensing a voltage on the terminal to generate a sensed voltage level; and
   comparing the sensed voltage level to the predetermined voltage level.

5. The method as recited in claim 1 further comprising configuring a power sourcing equipment based on an estimate of the size of the power transistor.

6. The method as recited in claim 1 wherein the digital time signal is used as a proxy for a gate-to-source capacitance of the power transistor.

7. The method as recited in claim 1 further comprising generating an indication of an error based on the digital time signal being less than a predetermined minimum value of the digital time signal.

8. The method as recited in claim 1 further comprising generating an indication of an error based on the digital time signal exceeding a predetermined maximum value of the digital time signal.

9. A system for delivering power over a transmission line, the system comprising:
   a terminal;
   a current source configured to provide a constant, predetermined current to the terminal thereby causing a power transistor coupled to the terminal to conduct in a subthreshold region of transistor operation without current flowing between a drain terminal of the power transistor and a source terminal of the power transistor; and
   a circuit configured to estimate a size of the power transistor using a digital time signal indicative of an amount of time the constant, predetermined current is provided before a voltage level on the terminal exceeds a predetermined voltage level.

10. The system as recited in claim 9 wherein the predetermined voltage level is less than a threshold voltage of the power transistor.

11. The system as recited in claim 9 wherein the circuit comprises a time-to-digital converter configured to generate the digital time signal based on the amount of time the current source is enabled before the voltage level on the terminal exceeds the predetermined voltage level.

12. The system as recited in claim 9 further comprising the power transistor coupled to the terminal.

13. The system as recited in claim 9 further comprising a driver coupled to the terminal, wherein the circuit is configured to adjust the driver based on a value of the digital time signal.

14. The system as recited in claim 13 wherein the circuit comprises:
   a processor; and
   software stored in a storage element coupled to the processor,
   wherein the software is executable by the processor to enable the current source, after disabling the current source, disable the current source in response to an indication of the voltage level on the terminal equaling or exceeding the predetermined voltage level, and after disabling the current source, configure the driver based on the value of the digital time signal within a predetermined range of the value of the digital time signal.

15. The system as recited in claim 9 further comprising the transmission line coupled to the power transistor, wherein the transmission line is an Ethernet cable.

16. The system as recited in claim 11 wherein the digital time signal is used as a proxy for a gate-to-source capacitance of the power transistor coupled to the terminal.

17. The system as recited in claim 11 further comprising a driver coupled to the terminal, wherein the circuit is configured to adjust the driver based on a value of the digital time signal.

18. The system as recited in claim 9 wherein the terminal, the current source, and the circuit are included in a power sourcing equipment and the transmission line is an Ethernet cable.

19. A method for establishing a powered link over a transmission line comprising:
   prior to entering a normal mode of operation, estimating a size of a power transistor coupled to a terminal using a digital time signal indicative of an amount of time the power transistor conducts in a subthreshold region of transistor operation without current flowing between a drain terminal of the power transistor and a source terminal of the power transistor before a voltage level on the terminal exceeds a predetermined voltage level; and
   configuring a power sourcing equipment based on the size of the power transistor estimated prior to entering the normal mode of operation.

20. The method as recited in claim 19 wherein the predetermined voltage level is less than a threshold voltage of the power transistor.

* * * * *